(12) United States Patent
Hanaoka et al.

(10) Patent No.: US 11,750,158 B2
(45) Date of Patent: Sep. 5, 2023

(54) RADIO FREQUENCY MODULE AND COMMUNICATION APPARATUS

(71) Applicant: Murata Manufacturing Co., Ltd., Nagaokakyo (JP)

(72) Inventors: Kunitoshi Hanaoka, Nagaokakyo (JP); Kiyoshi Aikawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 89 days.

(21) Appl. No.: 17/221,845

(22) Filed: Apr. 5, 2021

(65) Prior Publication Data

US 2021/0399699 A1 Dec. 23, 2021

(30) Foreign Application Priority Data

Jun. 19, 2020 (JP) ................................ 2020-106478

(51) Int. Cl.
*H03F 3/24* (2006.01)
*H03H 9/46* (2006.01)
*H05K 1/18* (2006.01)
*H04B 1/40* (2015.01)

(52) U.S. Cl.
CPC ............... *H03F 3/245* (2013.01); *H03H 9/46* (2013.01); *H04B 1/40* (2013.01); *H05K 1/181* (2013.01); *H03F 2200/451* (2013.01); *H05K 2201/1006* (2013.01); *H05K 2201/10151* (2013.01)

(58) Field of Classification Search
CPC ...... H03F 3/245; H03F 2200/451; H03F 3/72; H03F 2200/111; H03F 2200/294; H03F 3/195; H03F 2203/7209; H03H 9/46; H03H 9/02834; H03H 9/6489; H03H 9/542; H03H 9/6483; H03H 2210/025; H03H 2009/02204; H03H 2210/04; H03H 9/6403; H03H 2240/00; H04B 1/40; H05K 1/181; H05K 2201/1006; H05K 2201/10151; H05K 1/025; Y02P 70/50; H03B 5/1256; H03B 5/368; H03B 5/04; H03J 3/04

See application file for complete search history.

(56) References Cited

U.S. PATENT DOCUMENTS 4,851,792 A * 7/1989 Ochiai .................... H03L 1/022
331/177 V
11,310,355 B2 * 4/2022 Shinozaki ................ H04B 1/18
2002/0149434 A1* 10/2002 Toncich .................... H03L 7/18
331/158

(Continued)

FOREIGN PATENT DOCUMENTS

JP 2018-42100 A 3/2018
WO WO-2009035797 A2 * 3/2009 ........... G01N 29/022
WO 2015/002127 A1 1/2015

*Primary Examiner* — Lana N Le

(74) *Attorney, Agent, or Firm* — XSENSUS LLP

(57) ABSTRACT

A radio frequency module includes a mount board, an acoustic wave filter, a temperature sensor, and a correction circuit. The mount board has a first principal surface and a second principal surface on opposite sides of the mount board. The acoustic wave filter is disposed on the first principal surface side of the mount board. The temperature sensor is disposed on the second principal surface side of the mount board. The correction circuit corrects a pass band of the acoustic wave filter in accordance with a temperature measured by the temperature sensor.

19 Claims, 6 Drawing Sheets

(56) References Cited

U.S. PATENT DOCUMENTS

| | | | |
|---|---|---|---|
| 2011/0037170 A1* | 2/2011 | Shinohara | H01L 21/565 257/737 |
| 2012/0313731 A1 | 12/2012 | Burgener et al. | |
| 2017/0310330 A1* | 10/2017 | Nakajima | H03L 7/099 |
| 2019/0267971 A1* | 8/2019 | Caron | H04B 1/40 |
| 2021/0058069 A1* | 2/2021 | Komatsu | H03H 9/6483 |
| 2021/0091800 A1* | 3/2021 | Sawada | H03F 3/72 |
| 2022/0189893 A1* | 6/2022 | Yoshimi | H01L 23/367 |

* cited by examiner

RADIO FREQUENCY MODULE AND COMMUNICATION APPARATUS

CROSS REFERENCE TO RELATED APPLICATION

The present application claims priority to Japanese patent application JP2020-106478, filed Jun. 19, 2020, the entire contents of which being incorporated herein by reference.

BACKGROUND

1. Field

The present disclosure relates generally to a radio frequency module and a communication apparatus, and more particularly to a radio frequency module including an acoustic wave filter and a temperature sensor and to a communication apparatus including the radio frequency module.

2. Description of the Related Art

International Publication No. 2015/002127 describes a power amplification (PA) module (radio frequency module) including a variable filter circuit (acoustic wave filter) and a temperature sensor. In the PA module described in International Publication No. 2015/002127, the temperature sensor is used for correcting a change in impedance of the variable filter circuit caused by a change in temperature.

If the temperature sensor is mounted on or in a mount board on or in which the variable filter circuit is mounted in the PA module described in International Publication No. 2015/002127, isolation between the variable filter circuit and the temperature sensor may deteriorate depending on the location where the temperature sensor is mounted.

SUMMARY

Accordingly, one aspect of the present disclosure to provide a radio frequency module and a communication apparatus capable of suppressing deterioration of isolation between an acoustic wave filter and a temperature sensor.

According to embodiments of the present disclosure, a radio frequency module includes a mount board, an acoustic wave filter, a temperature sensor, and a correction circuit. The mount board has a first principal surface and a second principal surface on opposite sides of the mount board. The acoustic wave filter is disposed on the first principal surface side of the mount board. The temperature sensor is disposed on the second principal surface side of the mount board. The correction circuit corrects a pass band of the acoustic wave filter in accordance with a temperature measured by the temperature sensor.

According to embodiments of the present disclosure, a communication apparatus includes the radio frequency module and a signal processing circuit. The signal processing circuit is connected to the radio frequency module and processes a radio frequency signal.

The radio frequency module and the communication apparatus according to the embodiments of the present disclosure are capable of suppressing deterioration of isolation between the acoustic wave filter and the temperature sensor.

Other features, elements, characteristics, and advantages of the present disclosure will become more apparent from the following detailed description of embodiments of the present disclosure with reference to the attached drawings.

DESCRIPTION OF THE EMBODIMENTS

Figure 1:
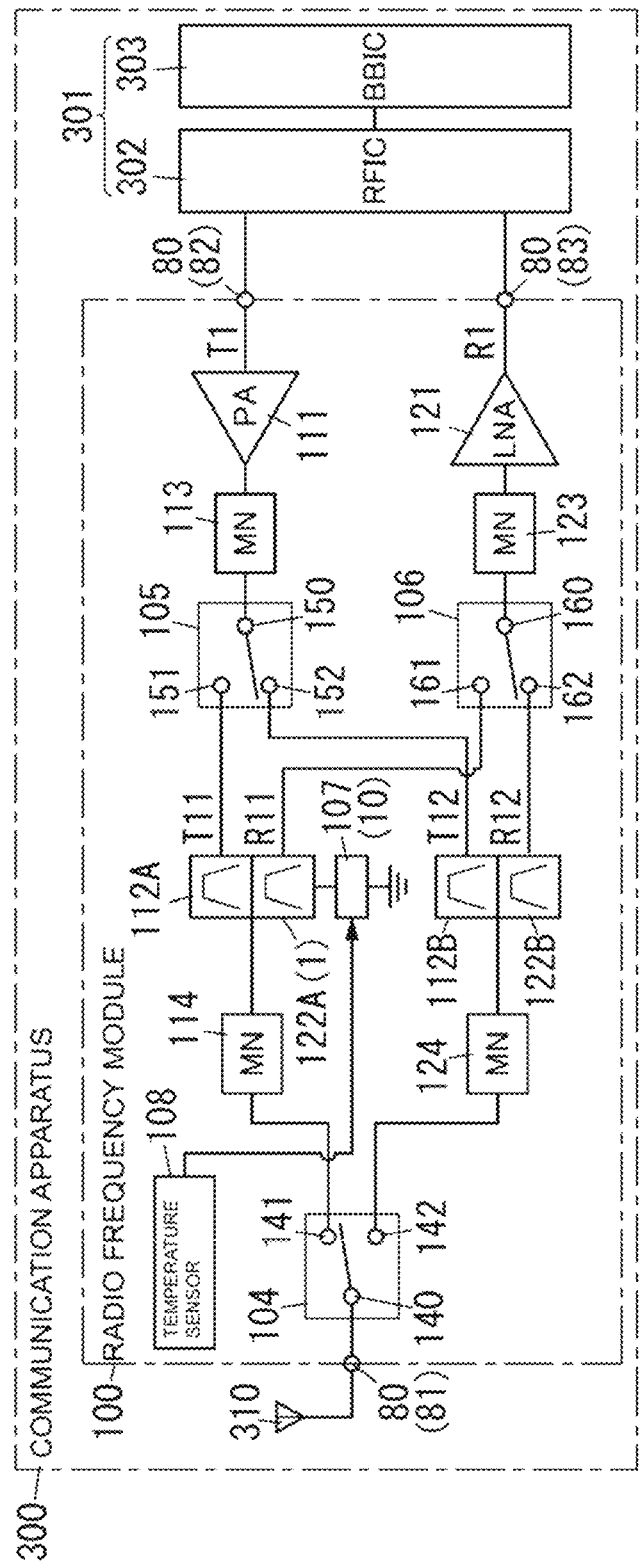
FIG. 1 is a diagram illustrating circuit configurations of a radio frequency module (or RF front-end circuitry) and a communication apparatus according to a first embodiment.

FIGS. 3 to 6 and FIGS. 8 to 11 to be referred to in a first embodiment and a second embodiment, respectively, are schematic diagrams. Thus, size and thickness ratios of components illustrated in the figures do not necessarily reflect actual dimension ratios.

In the present disclosure, the expression "any component is disposed on a first principal surface side of a mount board" refers to a state in which the component is disposed to be closer to the first principal surface than to a second principal surface of the mount board having the first principal surface and the second principal surface facing each other. Examples of the state in which "any component is disposed on a first principal surface side of a mount board" include a case where the component is disposed at the first principal surface of the mount board and a case where the component is disposed to be separate from the first principal surface of the mount board. Examples of the state in which "the component is disposed at the first principal surface of the mount board" include a case where the component is mounted on the first principal surface of the mount board and a case where part of the component is located on the first principal surface of the mount board and the rest of the component is embedded in the mount board (i.e., below a plane of a portion of the mount board that that has a largest surface area). Examples of the state in which "the component is disposed to be separate from the first principal surface of the mount board" include a case where the component and another component are stacked. In this case, the other component is disposed at the first principal surface of the mount board, and the component is stacked on the other component. Still another component may be present between the component and the other component.

Likewise, in the present disclosure, the expression "any component is disposed on the second principal surface side of the mount board" refers to a state in which the component is disposed to be closer to the second principal surface than to the first principal surface of the mount board having the first principal surface and the second principal surface facing each other. Examples of the state in which "any component is disposed on the second principal surface side of the mount board" include a case where the component is disposed at the second principal surface of the mount board and a case where the component is disposed to be separate from the second principal surface of the mount board. Examples of the state in which "the component is disposed at the second principal surface of the mount board" include a case where the component is mounted on the second principal surface of the mount board and a case where part of the component is located on the second principal surface of the mount board and the rest of the component is embedded in the mount board. Examples of the state in which "the component is disposed to be separate from the second principal surface of the mount board" include a case where the component and another component are stacked. In this case, the other component is disposed at the second principal surface of the mount board, and the component is stacked on the other component. Still another component may be present between the component and the other component.

First Embodiment

Figure 2A:
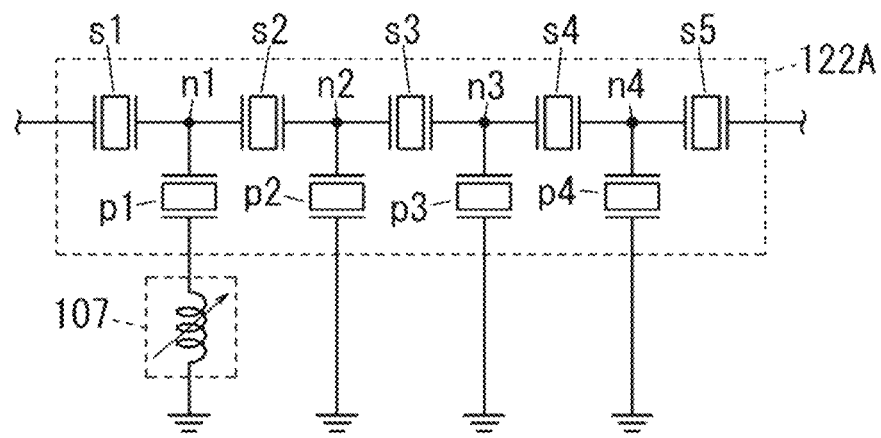
FIG. 2A is a diagram illustrating a circuit configuration of an acoustic wave filter of the radio frequency module according to the first embodiment.
Figure 2B:
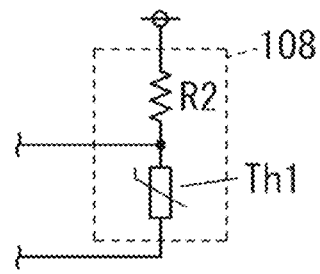
FIG. 2B is a diagram illustrating a circuit configuration of a temperature sensor of the radio frequency module according to the first embodiment.
Figure 3:
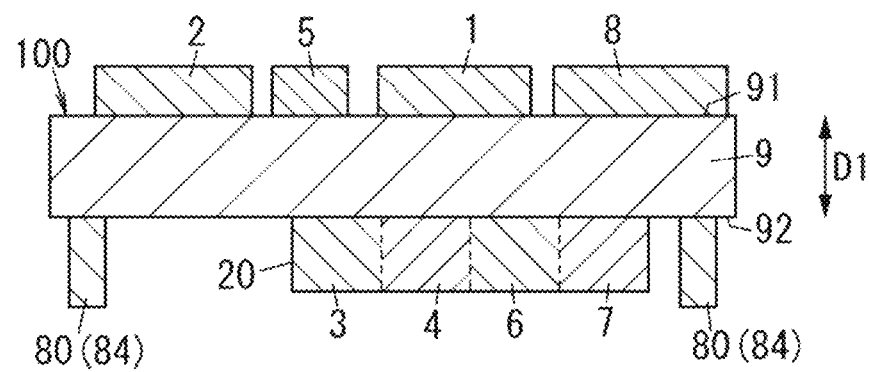
FIG. 3 is a sectional view of the radio frequency module according to the first embodiment.

As illustrated in FIGS. 1 to 3, a radio frequency module 100 according to a first embodiment includes a mount board 9, an acoustic wave filter 1, a temperature sensor 108, and a correction circuit 10. The mount board 9 has a first principal surface 91 and a second principal surface 92 facing each other. The acoustic wave filter 1 is disposed on the first principal surface 91 side. The temperature sensor 108 is disposed on the second principal surface 92 side. The correction circuit 10 corrects a pass band of the acoustic wave filter 1 in accordance with a temperature measured by the temperature sensor 108. With such a configuration, the radio frequency module 100 according to the first embodiment can suppress deterioration of isolation between the acoustic wave filter 1 and the temperature sensor 108.

The radio frequency module 100 and a communication apparatus 300 according to the first embodiment will be described below with reference to FIGS. 1 to 6.

(1) RADIO FREQUENCY MODULE AND COMMUNICATION APPARATUS (1.1) Circuit Configurations of Radio Frequency Module and Communication Apparatus Circuit configurations of the radio frequency module 100 and the communication apparatus 300 according to the first embodiment will be described first with reference to FIG. 1.

The radio frequency module 100 according to the first embodiment is used, for example, in the communication apparatus 300. The communication apparatus 300 is, for example, but not limited to, a mobile phone (e.g., a smartphone). The communication apparatus 300 may be, for example, a wearable terminal (e.g., a smartwatch). The radio frequency module 100 is a module conforming to the fourth-generation mobile communication (4G) specification and the fifth-generation mobile communication (5G) specification, for example. The 4G specification is, for example, Third Generation Partnership Project (3GPP) Long Term Evolution (LTE). The 5G specification is, for example, 5G New Radio (NR). The radio frequency module 100 is a module that supports carrier aggregation and dual connectivity. In this exemplary configuration the communication apparatus 300 is a multi-band transceiver. As used in this specification the term "module", as used with "radio frequency module", or "RF front-end module" should be construed as circuitry (programmable, as well as discrete) and associated circuit components, such as circuit boards, RF shielding, etc.

For example, the radio frequency module 100 is capable of amplifying a transmission signal (radio frequency signal) input thereto from a signal processing circuit 301 and outputting the amplified transmission signal to an antenna 310. The radio frequency module 100 is also capable of amplifying a reception signal (radio frequency signal) input thereto from the antenna 310 and outputting the amplified reception signal to the signal processing circuit 301. The signal processing circuit 301 is not a component of the radio frequency module 100 but is a component of the communication apparatus 300 including the radio frequency module 100. The radio frequency module 100 is controlled by, for example, the signal processing circuit 301 of the communication apparatus 300. The communication apparatus 300 includes the radio frequency module 100 and the signal processing circuit 301. The communication apparatus 300 further includes the antenna 310. The communication apparatus 300 further includes a circuit board on or in which the radio frequency module 100 is mounted. The circuit board is, for example, a printed circuit board. The circuit board has a ground electrode to be supplied with a ground potential.

The signal processing circuit 301 includes, for example, a radio frequency (RF) signal processing circuit 302 and a baseband signal processing circuit 303. The RF signal processing circuit 302 is, for example, a radio frequency integrated circuit (RFIC) and performs signal processing on a radio frequency signal. For example, the RF signal processing circuit 302 performs signal processing such as up-conversion on a radio frequency signal (transmission signal) output from the baseband signal processing circuit 303, and outputs the radio frequency signal having undergone the signal processing. For example, the RF signal processing circuit 302 performs signal processing such as down-conversion on a radio frequency signal (reception signal) output from the radio frequency module 100 and outputs the radio frequency signal having undergone the signal processing to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal or image signal input from outside. The baseband signal processing circuit 303 performs IQ modulation processing by combining the I-phase signal and the Q-phase signal, and outputs the resultant transmission signal. The transmission signal generated at this time is a modulated signal (IQ signal) obtained by performing amplitude modulation, on a carrier signal having a predetermined frequency, with a period longer than the period of the carrier signal. The reception signal processed by the baseband signal processing circuit 303 is used, for example, as an image signal for displaying an image or as an audio signal for a call. The radio frequency module 100 transfers a radio frequency signal (reception signal or transmission signal) between the antenna 310 and the RF signal processing circuit 302 of the signal processing circuit 301.

The radio frequency module 100 includes a power amplifier 111 and a low noise amplifier 121. The radio frequency module 100 also includes a plurality of (two in the illustrated example) transmission filters 112A and 112B and a plurality of (two in the illustrated example) reception filters 122A and 122B. The radio frequency module 100 further includes an output matching circuit 113, an input matching circuit 123, and a plurality of (two in the illustrated example) matching circuits 114 and 124. The radio frequency module 100 further includes a first switch 104, a second switch 105, and a third switch 106. The radio frequency module 100 also includes a digitally tunable inductor 107 and the temperature sensor 108. In the radio frequency module 100 according to the first embodiment, the reception filter 122A serves as the acoustic wave filter 1 described above. In the radio frequency module 100 according to the first embodiment, the digitally tunable inductor 107 serves as the correction circuit 10 described above.

The radio frequency module 100 also includes a plurality of external connection terminals 80. The plurality of external connection terminals 80 include an antenna terminal 81, a signal input terminal 82, a signal output terminal 83, and a plurality of ground terminals 84 (see FIG. 3). The plurality of ground terminals 84 are terminals that are electrically connected to the ground electrode of the above-described circuit board of the communication apparatus 300 and are supplied with a ground potential.

The power amplifier 111 is disposed in a signal path T1 for a transmission signal. The power amplifier 111 has an input terminal and an output terminal. The power amplifier 111 amplifies a transmission signal of a first frequency band input to the input terminal thereof and outputs the amplified transmission signal from the output terminal thereof. The first frequency band includes, for example, a first communication band and a second communication band. The first communication band corresponds to a transmission signal that passes through the transmission filter 112A and is, for example, Band 11 defined by the 3GPP LTE specification. The second communication band corresponds to a transmission signal that passes through the transmission filter 112B and is, for example, Band 22 defined by the 3GPP LTE specification.

The input terminal of the power amplifier 111 is connected to the signal input terminal 82. The input terminal of the power amplifier 111 is connected to the signal processing circuit 301 with the signal input terminal 82 interposed therebetween. The signal input terminal 82 is a terminal for inputting a radio frequency signal (transmission signal) from an external circuit (e.g., the signal processing circuit 301) to the radio frequency module 100. The output terminal of the power amplifier 111 is connected to a common terminal 150 of the second switch 105 with the output matching circuit 113 interposed therebetween. The power amplifier 111 is controlled by, for example, the signal processing circuit 301.

The low noise amplifier 121 is disposed in a signal path R1 for a reception signal. The low noise amplifier 121 has an input terminal and an output terminal. The low noise amplifier 121 amplifies a reception signal of a second frequency band input to the input terminal thereof and outputs the amplified reception signal from the output terminal thereof. Similar to the first frequency band, the second frequency band includes, for example, a first communication band and a second communication band.

The input terminal of the low noise amplifier 121 is connected to a common terminal 160 of the third switch 106 with the input matching circuit 123 interposed therebetween. The output terminal of the low noise amplifier 121 is connected to the signal output terminal 83. The output terminal of the low noise amplifier 121 is connected to the signal processing circuit 301 with the signal output terminal 83 interposed therebetween, for example. The signal output terminal 83 is a terminal for outputting a radio frequency signal (reception signal) from the low noise amplifier 121 to an external circuit (e.g., the signal processing circuit 301).

The transmission filter 112A is, for example, a filter having, as a pass band, a transmission band of the first communication band. The transmission filter 112B is, for example, a filter having, as a pass band, a transmission band of the second communication band. The reception filter 122A is, for example, a filter having, as a pass band, a reception band of the first communication band. The reception filter 122B is, for example, a filter having, as a pass band, a reception band of the second communication band. In the radio frequency module 100 according to the first embodiment, the transmission filter 112A and the reception filter 122A constitute a first duplexer, and the transmission filter 112B and the reception filter 122B constitute a second duplexer.

The first switch 104 includes a common terminal 140, and a plurality of (two in the illustrated example) selection terminals 141 and 142. The common terminal 140 is connected to the antenna terminal 81. The antenna 310 is connected to the antenna terminal 81. The selection terminal 141 is connected to an output terminal of the transmission filter 112A and an input terminal of the reception filter 122A. The selection terminal 142 is connected to an output terminal of the transmission filter 112B and an input terminal of the reception filter 122B. The first switch 104 is, for example, a switch capable of connecting at least one of the plurality of selection terminals 141 and 142 to the common terminal 140. The first switch 104 is, for example, a switch that enables one-to-one connection and one-to-multiple connection.

The first switch 104 is provided for both the signal path T1 (T11 and T12) for a transmission signal and the signal path R1 (R11 and R12) for a reception signal. More specifically, the first switch 104 is provided for the signal path T11 for a transmission signal in which the power amplifier 111, the output matching circuit 113, the second switch 105, the transmission filter 112A, and the matching circuit 114 are disposed. The first switch 104 is provided also for the signal path T12 for a transmission signal in which the power amplifier 111, the output matching circuit 113, the second switch 105, the transmission filter 112B, and the matching circuit 124 are disposed. The first switch 104 is provided for the signal path R11 for a reception signal in which the matching circuit 114, the reception filter 122A, the third switch 106, the input matching circuit 123, and the low noise amplifier 121 are disposed. The first switch 104 is provided also for the signal path R12 for a reception signal in which the matching circuit 124, the reception filter 122B, the third switch 106, the input matching circuit 123, and the low noise amplifier 121 are disposed.

The first switch 104 is controlled by, for example, the signal processing circuit 301. The first switch 104 switches connection states between the common terminal 140 and the plurality of selection terminals 141 and 142 in accordance with a control signal from the RF signal processing circuit 302 of the signal processing circuit 301. The first switch 104 is, for example, a switch integrated circuit (IC).

The second switch 105 includes the common terminal 150, and a plurality of (two in the illustrated example) selection terminals 151 and 152. The common terminal 150 is connected to the output terminal of the power amplifier 111 with the output matching circuit 113 interposed therebetween. The selection terminal 151 is connected to the input terminal of the transmission filter 112A. The selection terminal 152 is connected to the input terminal of the transmission filter 112B. The second switch 105 is, for example, a switch capable of connecting at least one of the plurality of selection terminals 151 and 152 to the common terminal 150. The second switch 105 is, for example, a switch that enables one-to-one connection and one-to-multiple connection. The second switch 105 is a switch having a function of switching between the plurality of signal paths T11 and T12 for transmission signals of communication bands different from each other.

The second switch 105 is controlled by, for example, the signal processing circuit 301. The second switch 105 switches connection states between the common terminal 150 and the plurality of selection terminals 151 and 152 in accordance with a control signal from the RF signal processing circuit 302 of the signal processing circuit 301. The second switch 105 is, for example, a switch IC.

The third switch 106 includes the common terminal 160, and a plurality of (two in the illustrated example) selection terminals 161 and 162. The common terminal 160 is connected to the input terminal of the low noise amplifier 121 with the input matching circuit 123 interposed therebetween. The selection terminal 161 is connected to the output terminal of the reception filter 122A. The selection terminal 162 is connected to the output terminal of the reception filter 122B. The third switch 106 is, for example, a switch capable of connecting at least one of the plurality of selection terminals 161 and 162 to the common terminal 160. The third switch 106 is, for example, a switch that enables one-to-one connection and one-to-multiple connection. The third switch 106 is a switch having a function of switching between the plurality of signal paths R11 and R12 for reception signals of communication bands different from each other.

The third switch 106 is controlled by, for example, the signal processing circuit 301. The third switch 106 switches connection states between the common terminal 160 and the plurality of selection terminals 161 and 162 in accordance with a control signal from the RF signal processing circuit 302 of the signal processing circuit 301. The third switch 106 is, for example, a switch IC.

The output matching circuit 113 is disposed in a signal path between the output terminal of the power amplifier 111 and the common terminal 150 of the second switch 105. The output matching circuit 113 is a circuit for achieving impedance matching between the power amplifier 111 and the transmission filters 112A and 112B. The output matching circuit 113 includes, for example, a single inductor. However, the configuration is not limited to this, and the output matching circuit 113 may include a plurality of inductors and a plurality of capacitors, for example.

The input matching circuit 123 is disposed in a signal path between the input terminal of the low noise amplifier 121 and the common terminal 160 of the third switch 106. The input matching circuit 123 is a circuit for achieving impedance matching between the low noise amplifier 121 and the reception filters 122A and 122B. The input matching circuit 123 includes, for example, a single inductor. However, the configuration is not limited to this, and the input matching circuit 123 may include a plurality of inductors and a plurality of capacitors, for example.

The matching circuit 114 is disposed in a signal path between the selection terminal 141 of the first switch 104, and the output terminal of the transmission filter 112A and the input terminal of the reception filter 122A. The matching circuit 114 is a circuit for achieving impedance matching between the first switch 104, and the transmission filter 112A and the reception filter 122A. The matching circuit 114 includes, for example, a single inductor. However, the configuration is not limited to this, and the matching circuit 114 may include a plurality of inductors and a plurality of capacitors, for example.

The matching circuit 124 is disposed in a signal path between the selection terminal 142 of the first switch 104, and the output terminal of the transmission filter 112B and the input terminal of the reception filter 122B. The matching circuit 124 is a circuit for achieving impedance matching between the first switch 104, and the transmission filter 112B and the reception filter 122B. The matching circuit 124 includes, for example, a single inductor. However, the configuration is not limited to this, and the matching circuit 124 may include a plurality of inductors and a plurality of capacitors, for example.

The digitally tunable inductor 107 includes a plurality of inductors and a plurality of switches (variable control switches). The plurality of inductors and the plurality of switches have a one-to-one correspondence. Each of the plurality of inductors is connected in series with the corresponding one of the plurality of switches. That is, the digitally tunable inductor 107 includes a plurality of series circuits in each of which an inductor and a switch are connected in series with each other. In the radio frequency module 100 according to the first embodiment, the digitally tunable inductor 107 is capable of changing the inductance value by switching each of the plurality of switches thereof on or off. That is, in the radio frequency module 100 according to the first embodiment, the digitally tunable inductor 107 is a circuit element connected to the acoustic wave filter 1. By changing the inductance value (parameter) of the digitally tunable inductor 107, the pass band of the acoustic wave filter 1 can be corrected.

The temperature sensor 108 includes a thermistor Th1 as illustrated in FIG. 2B. The thermistor Th1 is, for example, a positive temperature coefficient (PTC) thermistor. The thermistor Th1 is connected to a power supply with a resistor R2 interposed therebetween. The temperature sensor 108 is capable of detecting a target temperature by detecting a voltage across the thermistor Th1. As illustrated in FIG. 3, in the radio frequency module 100 according to the first embodiment, the acoustic wave filter 1 which is a first electronic component 1 (described later) is disposed on the first principal surface 91 side of the mount board 9, and the temperature sensor 108 which is a sixth electronic component 6 (described later) is disposed on the second principal surface 92 side of the mount board 9. Thus, in the radio frequency module 100 according to the first embodiment, the temperature sensor 108 measures, for example, a surface temperature of the low noise amplifier 121 (a third electronic component 3 in FIG. 3) which constitutes a chip 20 (see FIG. 3) together with the temperature sensor 108 (the sixth electronic component 6 in FIG. 3). The measurement result obtained by the temperature sensor 108 is input to the RF signal processing circuit 302 of the signal processing circuit 301, for example. Based on the surface temperature of the low noise amplifier 121, the RF signal processing circuit 302 calculates (estimates) a surface temperature of the acoustic wave filter 1 in accordance with a correlation between the surface temperature of the acoustic wave filter 1 and the surface temperature of the low noise amplifier 121. Based on the surface temperature of the acoustic wave filter 1, the RF signal processing circuit 302 controls on/off of the plurality of switches of the digitally tunable inductor 107 to adjust the inductance value of the digitally tunable inductor 107.

(1.2) Structure of Radio Frequency Module

A structure of the radio frequency module 100 according to the first embodiment will be described next with reference to FIGS. 2A, 2B, and 3.

As illustrated in FIG. 3, the radio frequency module 100 according to the first embodiment includes the mount board 9, a plurality of electronic components, and the plurality of external connection terminals 80. The plurality of electronic components include the first electronic component 1, a second electronic component 2, the third electronic component 3, a fourth electronic component 4, a fifth electronic component 5, the sixth electronic component 6, a seventh electronic component 7, and an eighth electronic component 8. The first electronic component 1 is, for example, the reception filter 122A. The second electronic component 2 is, for example, the power amplifier 111. The third electronic component 3 is, for example, the low noise amplifier 121. The fourth electronic component 4 is, for example, the first switch 104. The fifth electronic component 5 is, for example, the output matching circuit 113. The sixth electronic component 6 is, for example, the temperature sensor 108. The seventh electronic component 7 is, for example, the plurality of switches of the digitally tunable inductor 107. The eighth electronic component 8 is, for example, the plurality of inductors of the digitally tunable inductor 107.

The mount board 9 has the first principal surface 91 and the second principal surface 92, internal surfaces of which facing each other, and external surfaces of which face away from each other, in a thickness direction D1 of the mount board 9. The mount board 9 is, for example, a multilayer board including a plurality of dielectric layers and a plurality of conductive layers. The plurality of dielectric layers and the plurality of conductive layers are stacked in the thickness direction D1 of the mount board 9. The plurality of conductive layers have predetermined patterns set for the respective layers. Each of the plurality of conductive layers includes one or a plurality of conductor portions in a single plane orthogonal to the thickness direction D1 of the mount board 9. A material of each conductive layer is, for example, copper. The plurality of conductive layers include a ground layer. In the radio frequency module 100, the plurality of ground terminals 84 and the ground layer are electrically connected to each other with via conductors or the like of the mount board 9 interposed therebetween. The mount board 9 is, for example, a low temperature co-fired ceramics (LTCC) board. The mount board 9 is not limited to the LTCC board, and may be, for example, a printed circuit board, a high temperature co-fired ceramics (HTCC) board, or a multilayer resin board.

The mount board 9 is not limited to the LTCC board, and may be, for example, a wiring structure. The wiring structure is, for example, a multilayer structure. The multilayer structure includes at least one insulating layer and at least one conductive layer. The insulating layer has a predetermined pattern. When there are a plurality of insulating layers, the plurality of insulating layers have predetermined patterns set for the respective layers. The conductive layer has a predetermined pattern different from the predetermined pattern of the insulating layer. When there are a plurality of conductive layers, the plurality of conductive layers have predetermined patterns set for the respective layers. The conductive layer may include one or a plurality of rewiring portions. Among two surfaces of the wiring structure that face each other in a thickness direction of the multilayer structure, a first surface is the first principal surface 91 of the mount board 9 and a second surface is the second principal surface 92 of the mount board 9. The wiring structure may be, for example, an interposer. The interposer may be a silicon substrate or a multilayer substrate.

The first principal surface 91 and the second principal surface 92 of the mount board 9 are separate from each other in the thickness direction D1 of the mount board 9 and intersect with the thickness direction D1 of the mount board 9. The first principal surface 91 of the mount board 9 is, for example, orthogonal to the thickness direction D1 of the mount board 9. However, for example, the first principal surface 91 may include a side surface of the conductor portion, as a surface that is not orthogonal to the thickness direction D1. The second principal surface 92 of the mount board 9 is, for example, orthogonal to the thickness direction D1 of the mount board 9. However, for example, the second principal surface 92 may include a side surface of the conductor portion, as a surface that is not orthogonal to the thickness direction D1. The first principal surface 91 and the second principal surface 92 of the mount board 9 may have fine depressions and projections, a depression portion, or a projection portion. The mount board 9 has a substantially rectangular shape in plan view in the thickness direction D1 of the mount board 9. However, the shape of the mount board 9 is not limited to this, and the mount board 9 may have, for example, a substantially square shape.

The power amplifier 111 (the second electronic component 2) is, for example, an IC chip including a substrate having a first principal surface and a second principal surface facing each other, and a circuit portion (IC portion) including a transistor formed on the first principal surface side of this substrate. The substrate is, for example, a gallium arsenide substrate. The circuit portion has a function of amplifying a transmission signal input to the input terminal of the power amplifier 111. The transistor is, for example, a heterojunction bipolar transistor (HBT). The power amplifier 111 may include, for example, a DC blocking capacitor. The IC chip including the power amplifier 111 is flip-chip mounted on the first principal surface 91 of the mount board 9 such that the first principal surface among the first principal surface and the second principal surface of the substrate is on the first principal surface 91 side of the mount board 9, for example. The IC chip including the power amplifier 111 has a substantially quadrangular outer peripheral shape in plan view in the thickness direction D1 of the mount board 9. The substrate of the IC chip including the power amplifier 111 is not limited to a gallium arsenide substrate and may be, for example, a silicon substrate, a silicon germanium substrate, or a gallium nitride substrate. The transistor is not limited to a bipolar transistor such as an HBT and may be, for example, a field-effect transistor (FET). The FET is, for example, a metal-oxide-semiconductor field-effect transistor (MOSFET).

The low noise amplifier 121 (the third electronic component 3) is, for example, an IC chip including a substrate having a first principal surface and a second principal surface facing each other, and a circuit portion (IC portion) formed on the first principal surface side of this substrate. The substrate is, for example, a silicon substrate. The circuit portion has a function of amplifying a reception signal input to the input terminal of the low noise amplifier 121. The low noise amplifier 121 is flip-chip mounted on the second principal surface 92 of the mount board 9 such that the first principal surface among the first principal surface and the second principal surface of the substrate is on the second principal surface 92 side of the mount board 9, for example. The low noise amplifier 121 has a substantially quadrangular outer peripheral shape in plan view in the thickness direction D1 of the mount board 9.

Each of the plurality of transmission filters 112A and 112B and the plurality of reception filters 122A and 122B is, for example, a ladder filter. The reception filter 122A, among the plurality of transmission filters 112A and 112B and the plurality of reception filters 122A and 122B, will be described with reference to FIG. 2A. The rest of the filters, i.e., the transmission filters 112A and 112B and the reception filter 122B, have substantially the same configuration.

As illustrated in FIG. 2A, the reception filter 122A has a plurality of (five in the illustrated example) series-arm resonators s1 to s5, and a plurality of (four in the illustrated example) parallel-arm resonators p1 to p4. The plurality of series-arm resonators s1 to s5 are connected in series with each other between the input terminal and the output terminal of the reception filter 122A. The parallel-arm resonator p1 is connected in series with the digitally tunable inductor 107 described above. The parallel-arm resonator p1 and the digitally tunable inductor 107 are connected between ground and a node n1 of the two series-arm resonators s1 and s2. The parallel-arm resonator p2 is connected between ground and a node n2 of the two series-arm resonators s2 and s3. The parallel-arm resonator p3 is connected between ground and a node n3 of the two series-arm resonators s3 and s4. The parallel-arm resonator p4 is connected between ground and a node n4 of the two series-arm resonators s4 and s5.

The reception filter 122A is, for example, an acoustic wave filter (hereinafter, also referred to as the "acoustic wave filter 1"). The plurality of series-arm resonators s1 to s5 and the plurality of parallel-arm resonators p1 to p4 of the acoustic wave filter 1 are acoustic wave resonators. The acoustic wave filter 1 is, for example, a surface acoustic wave filter that uses a surface acoustic wave. In the radio frequency module 100 according to the first embodiment, each of the transmission filters 112A and 112B and the reception filter 122B is an acoustic wave filter.

In the surface acoustic wave filter, the plurality of series-arm resonators s1 to s5 and the plurality of parallel-arm resonators p1 to p4 are, for example, surface acoustic wave (SAW) resonators.

The surface acoustic wave filter includes, for example, a substrate having a first principal surface and a second principal surface facing each other, and a circuit portion formed on the first principal surface side of this substrate. The substrate is a piezoelectric substrate. The piezoelectric substrate is, for example, a lithium tantalate substrate but may be a lithium niobate substrate. The circuit portion includes a plurality of interdigital transducer (IDT) electrodes which have a one-to-one correspondence with the plurality of series-arm resonators s1 to s5, and a plurality of IDT electrodes which have a one-to-one correspondence with the plurality of parallel-arm resonators p1 to p4.

Each of the plurality of transmission filters 112A and 112B and the plurality of reception filters 122A and 122B is, for example, a bare chip acoustic wave filter. Each of the plurality of transmission filters 112A and 112B and the plurality of reception filters 122A and 122B has a substantially quadrangular outer peripheral shape in plan view in the thickness direction D1 of the mount board 9. Each of the plurality of transmission filters 112A and 112B and the plurality of reception filters 122A and 122B is flip-chip mounted on the first principal surface 91 of the mount board 9 such that the first principal surface among the first principal surface and the second principal surface of the substrate is on the mount board 9 side, for example.

Each of the first switch 104 (the fourth electronic component 4), the second switch 105, and the third switch 106 is a switch IC. More specifically, each of the first switch 104, the second switch 105, and the third switch 106 is, for example, an IC chip including a substrate having a first principal surface and a second principal surface facing each other, and a circuit portion (IC portion) including an FET formed on the first principal surface side of this substrate. The substrate is, for example, a silicon substrate. The circuit portion is a functional unit having a function of switching the connection states between the common terminal and the plurality of selection terminals. The IC chip which is each of the first switch 104, the second switch 105, and the third switch 106 has a substantially quadrangular outer peripheral shape in plan view in the thickness direction D1 of the mount board 9. The first switch 104 is flip-chip mounted on the second principal surface 92 of the mount board 9 such that the first principal surface among the first principal surface and the second principal surface of the substrate is on the second principal surface 92 side of the mount board 9, for example. Each of the second switch 105 and the third switch 106 is flip-chip mounted on the first principal surface 91 of the mount board 9 such that the first principal surface among the first principal surface and the second principal surface of the substrate is on the first principal surface 91 side of the mount board 9, for example.

The inductor of the output matching circuit 113 (the fifth electronic component 5) is, for example, a chip inductor. The inductor of the output matching circuit 113 is disposed, but not limited to, on the first principal surface 91 side of the mount board 9, for example. The inductor has a substantially quadrangular outer peripheral shape in plan view in the thickness direction D1 of the mount board 9.

The inductor of the input matching circuit 123 is, for example, a chip inductor. The inductor of the input matching circuit 123 is disposed, but not limited to, on the first principal surface 91 side of the mount board 9, for example. The inductor has a substantially quadrangular outer peripheral shape in plan view in the thickness direction D1 of the mount board 9.

The plurality of external connection terminals 80 are disposed on the second principal surface 92 of the mount board 9. Each of the plurality of external connection terminals 80 is a substantially pillar-shaped (e.g., columnar) terminal. A material of the plurality of external connection terminals 80 is a metal (e.g., copper or a copper alloy).

The plurality of external connection terminals 80 include the plurality of ground terminals 84 in addition to the antenna terminal 81, the signal input terminal 82, and the signal output terminal 83 described above. As described above, the plurality of ground terminals 84 are electrically connected to the ground layer of the mount board 9. The ground layer is circuit ground of the radio frequency module 100.

As illustrated in FIG. 3, in the radio frequency module 100 according to the first embodiment, at least the first electronic component 1, the second electronic component 2, the fifth electronic component 5, and the eighth electronic component 8 are disposed on the first principal surface 91 side of the mount board 9. In the radio frequency module 100 according to the first embodiment, at least the third electronic component 3, the fourth electronic component 4, the sixth electronic component 6, and the seventh electronic component 7 are disposed on the second principal surface 92 side of the mount board 9. In the radio frequency module 100 according to the first embodiment, the third electronic component 3, the fourth electronic component 4, the sixth electronic component 6, and the seventh electronic component 7 are included in the single chip 20. That is, in the radio frequency module 100 according to the first embodiment, the low noise amplifier 121 (the third electronic component 3) and the temperature sensor 108 (the sixth electronic component 6) are included in the single chip 20. In the radio frequency module 100 according to the first embodiment, the low noise amplifier 121 (the third electronic component 3) and the first switch (switch) 104 (the fourth electronic component 4) are included in the single chip 20. Thus, the area of the mount board 9 in plan view in the thickness direction D1 of the mount board 9 can be reduced.

In the radio frequency module 100 according to the first embodiment, the plurality of switches (the seventh electronic component 7) and the plurality of inductors (the eighth electronic component 8), among the plurality of switches and the plurality of inductors of the digitally tunable inductor 107, are discrete components. In the radio frequency module 100 according to the first embodiment, the plurality of inductors are disposed on the first principal surface 91 side of the mount board 9, and the plurality of switches are disposed on the second principal surface 92 side of the mount board 9.

In the radio frequency module 100 according to the first embodiment, part of the acoustic wave filter 1 (the first electronic component 1) overlaps part of the temperature sensor 108 (the sixth electronic component 6) in plan view in the thickness direction D1 of the mount board 9. In the radio frequency module 100 according to the first embodiment, part of the acoustic wave filter 1 (the first electronic component 1) overlaps the entire first switch 104 (the fourth electronic component 4) in plan view in the thickness direction D1 of the mount board 9. Thus, the area of the mount board 9 in plan view in the thickness direction D1 of the mount board 9 can be reduced.

In the radio frequency module 100 according to the first embodiment, the power amplifier 111 (the second electronic component 2) overlaps neither the temperature sensor 108 (the sixth electronic component 6) nor the first switch 104 (the fourth electronic component 4) in plan view in the thickness direction D1 of the mount board 9. Thus, a ground electrode can be disposed in a region facing the power amplifier 111 in the mount board 9.

(2) CHARACTERISTICS OF RADIO FREQUENCY MODULE

Characteristics of the radio frequency module 100 according to the first embodiment will be described next.

In the radio frequency module 100 according to the first embodiment, the reception filter 122A serves as the acoustic wave filter 1 as described above. The acoustic wave filter 1 has characteristics that the pass band thereof changes depending on the surface temperature (ambient temperature) of the acoustic wave filter 1. Specifically, the pass band of the acoustic wave filter 1 changes (shifts) toward a low-frequency side as the surface temperature of the acoustic wave filter 1 increases. Thus, in a high-temperature environment, a radio frequency signal of a desired frequency band may be rejected by the acoustic wave filter 1.

As described above, the radio frequency module 100 according to the first embodiment includes the digitally tunable inductor 107, which serves as the correction circuit 10, and the temperature sensor 108. If the inductance value of the digitally tunable inductor 107 is adjusted in accordance with the temperature measured by the temperature sensor 108, the pass band that has shifted toward the low-frequency side owing to an increase in temperature can be shifted toward the high-frequency side. That is, the radio frequency module 100 according to the first embodiment can bring the pass band of the acoustic wave filter 1 closer to the desired frequency band even when the pass band of the acoustic wave filter 1 shifts toward the low-frequency side owing to an increase in surface temperature of the acoustic wave filter 1. This allows the use of a low-cost acoustic wave filter that involves a large pass-band shift owing to a change in temperature. Consequently, the low-cost radio frequency module 100 can be implemented. When an acoustic wave filter that involves a small pass-band shift owing to a change in temperature is used, a plurality of acoustic wave filters respectively corresponding to a plurality of bands can be implemented as a single chip. Consequently, the area of the mount board 9 in plan view in the thickness direction D1 of the mount board 9 can be reduced.

To measure the surface temperature of the acoustic wave filter 1, the acoustic wave filter 1 and the temperature sensor 108 are preferably disposed adjacently to each other on the same principal surface (the first principal surface 91 or the second principal surface 92) of the mount board 9. In this case, however, the radio frequency signal (reception signal in this case) that passes through the acoustic wave filter 1 may enter the signal path of the temperature sensor 108. That is, isolation between the acoustic wave filter 1 and the temperature sensor 108 may deteriorate. Therefore, in the radio frequency module 100 according to the first embodiment, the acoustic wave filter 1 is disposed on the first principal surface 91 side of the mount board 9 and the temperature sensor 108 is disposed on the second principal surface 92 side of the mount board 9 so that deterioration of isolation between the acoustic wave filter 1 and the temperature sensor 108 can be suppressed. As a result, deterioration of isolation between the acoustic wave filter 1 and the temperature sensor 108 can be suppressed.

(3) SUMMARY

(3.1) Radio Frequency Module

The radio frequency module 100 according to the first embodiment includes the mount board 9, the acoustic wave filter 1, the temperature sensor 108, and the correction circuit 10. The mount board 9 has the first principal surface 91 and the second principal surface 92 facing each other. The acoustic wave filter 1 is disposed on the first principal surface 91 side. The temperature sensor 108 is disposed on the second principal surface 92 side. The correction circuit 10 corrects the pass band of the acoustic wave filter 1 in accordance with a temperature measured by the temperature sensor 108.

As described above, in the radio frequency module 100 according to the first embodiment, the acoustic wave filter 1 is disposed on the first principal surface 91 side of the mount board 9, and the temperature sensor 108 is disposed on the second principal surface 92 side of the mount board 9. Therefore, degradation of isolation between the acoustic wave filter 1 and the temperature sensor 108 can be suppressed, compared with the case where the acoustic wave filter 1 and the temperature sensor 108 are disposed adjacently to each other on the same principal surface (the first principal surface 91 or the second principal surface 92) of the mount board 9, for example. Consequently, a radio frequency signal that passes through the acoustic wave filter 1 can be hindered from entering a path of the temperature sensor 108.

In the radio frequency module 100 according to the first embodiment, the pass band of the acoustic wave filter 1 can be corrected by adjusting the parameter (inductance value) of a circuit element (the digitally tunable inductor 107 in this case) connected to the acoustic wave filter 1 in accordance with a measurement result obtained by the temperature sensor 108.

(3.2) Communication Apparatus

The communication apparatus 300 according to the first embodiment includes the radio frequency module 100 described above, and the signal processing circuit 301. The signal processing circuit 301 is connected to the radio frequency module 100 and processes a radio frequency signal.

Since the communication apparatus 300 according to the first embodiment includes the radio frequency module 100, the communication apparatus 300 can suppress deterioration of isolation between the acoustic wave filter 1 and the temperature sensor 108. The communication apparatus 300 can also correct the pass band of the acoustic wave filter 1 in accordance with a measurement result obtained by the temperature sensor 108.

(4) MODIFICATIONS

Modifications of the first embodiment will be described below. The modifications described below may be adopted in combination as appropriate.

(4.1) First Modification

The radio frequency module 100 according to a first modification of the first embodiment will be described with reference to FIG. 4. Components of the radio frequency module 100 according to the first modification that are substantially the same as those of the radio frequency module 100 according to the first embodiment are denoted by the same reference signs, and description of these components are omitted.

In the radio frequency module 100 according to the first modification, a plurality of external connection terminals 80a have a substantially spherical shape, which is different from the radio frequency module 100 according to the first embodiment.

Figure 4:
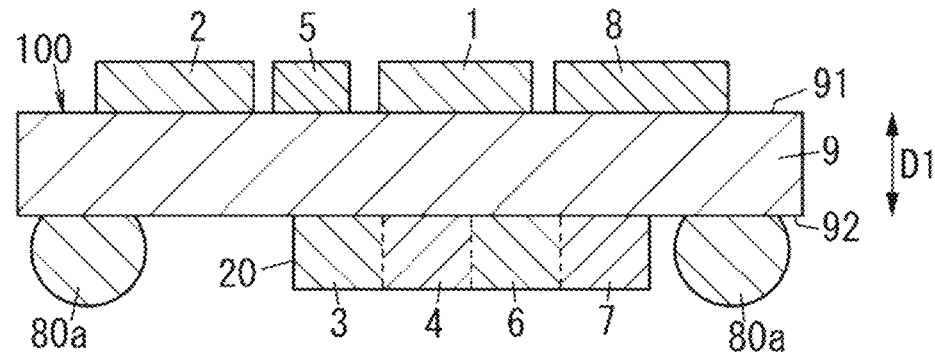
FIG. 4 is a sectional view of a radio frequency module according to a first modification of the first embodiment.

As illustrated in FIG. 4, each of the plurality of external connection terminals 80a is, for example, a ball bump having a substantially spherical shape. A material of the ball bump is, for example, gold, copper, or solder.

In the radio frequency module 100 according to the first modification, for example, at least one of the plurality of external connection terminals 80a may be a substantially pillar-shaped terminal, and the rest of the plurality of external connection terminals 80a may be substantially spherical terminals. That is, in the radio frequency module 100 according to the first modification, substantially pillar-shaped terminals and substantially spherical terminals may be used in combination as the plurality of external connection terminals 80a.

(4.2) Second Modification

Figure 5:
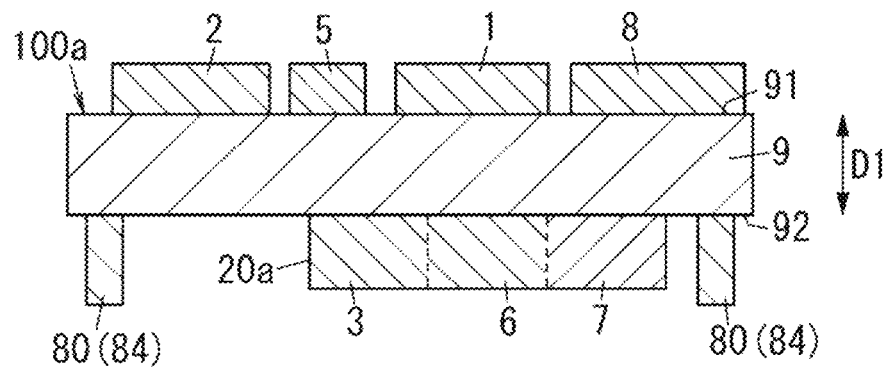
FIG. 5 is a sectional view of a radio frequency module according to a second modification of the first embodiment.

A radio frequency module 100a according to a second modification of the first embodiment will be described with reference to FIG. 5. Components of the radio frequency module 100a according to the second modification that are substantially the same as those of the radio frequency module 100 according to the first embodiment are denoted by the same reference signs, and description of these components are omitted.

In the radio frequency module 100a according to the second modification, the third electronic component 3, the sixth electronic component 6, and the seventh electronic component 7 are included in a single chip 20a, that is, the fourth electronic component 4 is not included in the chip 20a, which is different from the radio frequency module 100 according to the first embodiment.

The third electronic component 3 is, for example, the low noise amplifier 121. The sixth electronic component 6 is, for example, the temperature sensor 108. The seventh electronic component 7 is, for example, the plurality of switches of the digitally tunable inductor 107. That is, in the radio frequency module 100a according to the second modification, the low noise amplifier 121, the temperature sensor 108, and the plurality of switches are included in the single chip 20a.

In the radio frequency module 100a according to the second modification, the acoustic wave filter 1 (the first electronic component 1) is disposed on the first principal surface 91 side of the mount board 9, and the temperature sensor 108 (the sixth electronic component 6) is disposed on the second principal surface 92 side of the mount board 9. Thus, the radio frequency module 100a according to the second modification can also suppress deterioration of isolation between the acoustic wave filter 1 and the temperature sensor 108.

The radio frequency module 100a according to the second modification can also correct the pass band of the acoustic wave filter 1 by adjusting the inductance value of the digitally tunable inductor 107.

(4.3) Third Modifcation

Figure 6:
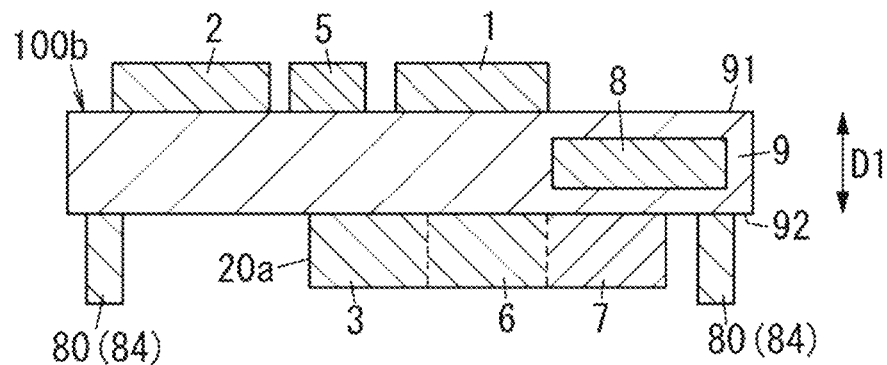
FIG. 6 is a sectional view of a radio frequency module according to a third modification of the first embodiment.

A radio frequency module 100b according to a third modification of the first embodiment will be described with reference to FIG. 6. Components of the radio frequency module 100b according to the third modification that are substantially the same as those of the radio frequency module 100a according to the second modification are denoted by the same reference signs, and description of these components are omitted.

In the radio frequency module 100b according to the third modification, the eighth electronic component 8 is embedded in the mount board 9, which is different from the radio frequency module 100a according to the second modification.

The eighth electronic component 8 is, for example, the plurality of inductors of the digitally tunable inductor 107. As illustrated in FIG. 6, the eighth electronic component 8 is embedded in the mount board 9. In this case, the eighth electronic component 8 may be disposed to be closer to the second principal surface 92 than to the first principal surface 91 or may be disposed to be closer to the first principal surface 91 than to the second principal surface 92 in the thickness direction D1 of the mount board 9.

In the radio frequency module 100b according to the third modification, the acoustic wave filter 1 (the first electronic component 1) is disposed on the first principal surface 91 side of the mount board 9, and the temperature sensor 108 (the sixth electronic component 6) is disposed on the second principal surface 92 side of the mount board 9. Thus, the radio frequency module 100b according to the third modification can also suppress deterioration of isolation between the acoustic wave filter 1 and the temperature sensor 108.

The radio frequency module 100b according to the third modification can also correct the pass band of the acoustic wave filter 1 by adjusting the inductance value of the digitally tunable inductor 107.

(4.4) Other Modifications

In the radio frequency module 100 according to the first embodiment, the digitally tunable inductor 107 serving as the correction circuit 10 is connected between ground and the parallel-arm resonator p1. Alternatively, the digitally tunable inductor 107 may be connected between ground and any of the parallel-arm resonator p2, p3, and p4, for example. The digitally tunable inductor 107 may be connected between ground and two or more parallel-arm resonators among the plurality of parallel-arm resonators p1 to p4. For example, the digitally tunable inductor 107 may be connected between ground and the parallel-arm resonator p1 and between ground and the parallel-arm resonator p2.

In the radio frequency module 100 according to the first embodiment, the reception filter 122A includes five series-arm resonators and four parallel-arm resonators. However, it is sufficient that the reception filter 122A includes one or more series-arm resonators and one or more parallel-arm resonators.

In the radio frequency module 100 according to the first embodiment, the thermistor Th1 included in the temperature sensor 108 is a PTC thermistor. Alternatively, the thermistor Th1 may be, for example, a negative temperature coefficient (NTC) thermistor or a critical temperature resistor (CTR) thermistor. The temperature sensor 108 includes, but not limited to, the thermistor Th1. The temperature sensor 108 may include, for example, a thermopile, a thermocouple, or a combination of two or more of the thermistor Th1, a thermopile, and a thermocouple.

In the radio frequency module 100 according to the first embodiment, part of the acoustic wave filter 1 (the first electronic component 1) overlaps part of the temperature sensor 108 (the sixth electronic component 6) in plan view in the thickness direction D1 of the mount board 9. However, the configuration is not limited to this. For example, the entire acoustic wave filter 1 may overlap the entire temperature sensor 108, the entire acoustic wave filter 1 may overlap part of the temperature sensor 108, or part of the acoustic wave filter 1 may overlap the entire temperature sensor 108 in plan view in the thickness direction D1 of the mount board 9.

In the radio frequency module 100 according to the first embodiment, part of the acoustic wave filter 1 (the first electronic component 1) overlaps the entire first switch 104 (the fourth electronic component 4) in plan view in the thickness direction D1 of the mount board 9. However, the configuration is not limited to this. For example, the entire acoustic wave filter 1 may overlap the entire first switch 104, the entire acoustic wave filter 1 may overlap part of the first switch 104, or part of the acoustic wave filter 1 may overlap part of the first switch 104 in plan view in the thickness direction D1 of the mount board 9.

In the radio frequency module 100 according to the first embodiment, the temperature sensor 108 measures the surface temperature of the low noise amplifier 121 that constitutes the chip 20 together with the temperature sensor 108. Alternatively, the temperature sensor 108 may measure the surface temperature of another circuit element. For example, the temperature sensor 108 may measure the surface temperature of the first switch 104 that constitutes the chip 20 together with the temperature sensor 108. In the radio frequency module 100 according to the first embodiment, the RF signal processing circuit 302 of the signal processing circuit 301 adjusts the inductance value of the digitally tunable inductor 107 in accordance with a measurement result obtained by the temperature sensor 108. The temperature sensor 108 may have this function. That is, the temperature sensor 108 may adjust the inductance value of the digitally tunable inductor 107 in accordance with the measurement result.

The acoustic wave filter 1 may be an acoustic wave filter including a first substrate, a low acoustic velocity film, a piezoelectric layer, a plurality of IDT electrodes, and a plurality of pad electrodes. The low acoustic velocity film is disposed on or above a first principal surface of the first substrate. The piezoelectric layer is disposed on or above the low acoustic velocity film. The plurality of IDT electrodes are disposed on the piezoelectric layer. The plurality of pad electrodes are disposed on or above the first principal surface of the first substrate. The acoustic wave filter 1 has a substantially rectangular shape in plan view in the thickness direction thereof. However, the shape is not limited to this and the acoustic wave filter 1 may have, for example, a substantially square shape.

The low acoustic velocity film is separate from the periphery of the first substrate in plan view in the thickness direction of the acoustic wave filter 1. The acoustic wave filter 1 further includes an insulating layer. The insulating layer covers a region that is not covered with the low acoustic velocity film on the first principal surface of the first substrate. The insulating layer has an electrically insulating property. The insulating layer is formed along the periphery of the first substrate on the first principal surface of the first substrate. The insulating layer surrounds the plurality of IDT electrodes. The insulating layer has a substantially frame shape (e.g., a substantially rectangular frame shape) in plan view in the thickness direction of the acoustic wave filter 1. Part of the insulating layer overlaps an outer peripheral portion of the piezoelectric layer in the thickness direction of the acoustic wave filter 1. An outer peripheral surface of the piezoelectric layer and an outer peripheral surface of the low acoustic velocity film are covered with the insulating layer. A material of the insulating layer is, for example, an epoxy resin or polyimide.

The plurality of pad electrodes are disposed above the first principal surface of the first substrate with the insulating layer interposed therebetween.

A material of the piezoelectric layer is, for example, lithium niobate or lithium tantalate. A material of the low acoustic velocity film is, for example, silicon oxide. An acoustic velocity of a bulk wave propagating through the low acoustic velocity film is lower than that of a bulk wave propagating through the piezoelectric layer. A material of the low acoustic velocity film is not limited to silicon oxide and may be, for example, glass, silicon oxynitride, tantalum (V) oxide, a compound of a silicon oxide and fluorine, carbon, or boron, or a material mainly containing one of the above materials.

The first substrate is, for example, a silicon substrate. An acoustic velocity of a bulk wave propagating through the first substrate is higher than that of an acoustic wave propagating through the piezoelectric layer. The bulk wave propagating through the first substrate is a bulk wave having the lowest acoustic velocity among the plurality of bulk waves propagating through the first substrate.

The piezoelectric layer has, for example, a thickness of approximately 3.5λ or less, where λ denotes the wavelength of an acoustic wave determined by the period of electrode fingers of the IDT electrode. The low acoustic velocity film has, for example, a thickness of approximately 2.0λ or less.

The acoustic wave filter 1 may further include a high acoustic velocity film disposed between the first substrate and the low acoustic velocity film. An acoustic velocity of a bulk wave propagating through the high acoustic velocity film is higher than that of an acoustic wave propagating through the piezoelectric layer. A material of the high acoustic velocity film is, for example, one material selected from the group consisting of diamond-like carbon, aluminum nitride, aluminum oxide, silicon carbide, silicon nitride, silicon, sapphire, a piezoelectric body (lithium tantalate, lithium niobate, or quartz crystal), alumina, zirconia, cordierite, mullite, steatite, forsterite, magnesia, and diamond. The material of the high acoustic velocity film may be a material mainly containing any of the above materials, or a material mainly containing a mixture including any of the above materials.

The acoustic wave filter 1 may include, for example, a close contact layer interposed between the low acoustic velocity film and the piezoelectric layer. The close contact layer is composed of, for example, a resin (epoxy resin or polyimide resin). The acoustic wave filter 1 may also include a dielectric film disposed between the low acoustic velocity film and the piezoelectric layer, on the piezoelectric layer, or under the low acoustic velocity film.

Second Embodiment

A radio frequency module 100c and a communication apparatus 300c according to a second embodiment will be described below with reference to FIGS. 7 to 12. Components of the radio frequency module 100c according to the second embodiment that are substantially the same as those of the radio frequency module 100 according to the first embodiment are denoted by the same reference signs, and description of these components are omitted.

In the radio frequency module 100c according to the second embodiment, a matching circuit 114c connected between the first switch 104 and the first duplexer (the transmission filter 112A and the reception filter 122A) serves as a correction circuit 10c, which is different from the radio frequency module 100 according to the first embodiment.

(1) RADIO FREQUENCY MODULE AND COMMUNICATION APPARATUS (1.1) Circuit Configurations of Radio Frequency Module and Communication Apparatus Circuit configurations of the radio frequency module 100c and the communication apparatus 300c according to the second embodiment will be described first with reference to FIG. 7.

The communication apparatus 300c includes the radio frequency module 100c and the signal processing circuit 301. The signal processing circuit 301 includes the RF signal processing circuit 302 and the baseband signal processing circuit 303.

The radio frequency module 100c includes the power amplifier 111 and the low noise amplifier 121. The radio frequency module 100c also includes the plurality of (two in the illustrated example) transmission filters 112A and 112B and the plurality of (two in the illustrated example) reception filters 122A and 122B. The radio frequency module 100c further includes the output matching circuit 113, the input matching circuit 123, and the plurality of (two in the illustrated example) matching circuits 114c and 124. The radio frequency module 100c further includes the first switch 104, the second switch 105, and the third switch 106. The radio frequency module 100c also includes the digitally tunable inductor 107 and the temperature sensor 108.

The radio frequency module 100c includes the plurality of external connection terminals 80. The plurality of external connection terminals 80 include the antenna terminal 81, the signal input terminal 82, the signal output terminal 83, and the plurality of ground terminals 84 (see FIG. 8). The plurality of ground terminals 84 are terminals that are electrically connected to a ground electrode of a circuit board of the communication apparatus 300c and are supplied with a ground potential.

Figure 7:
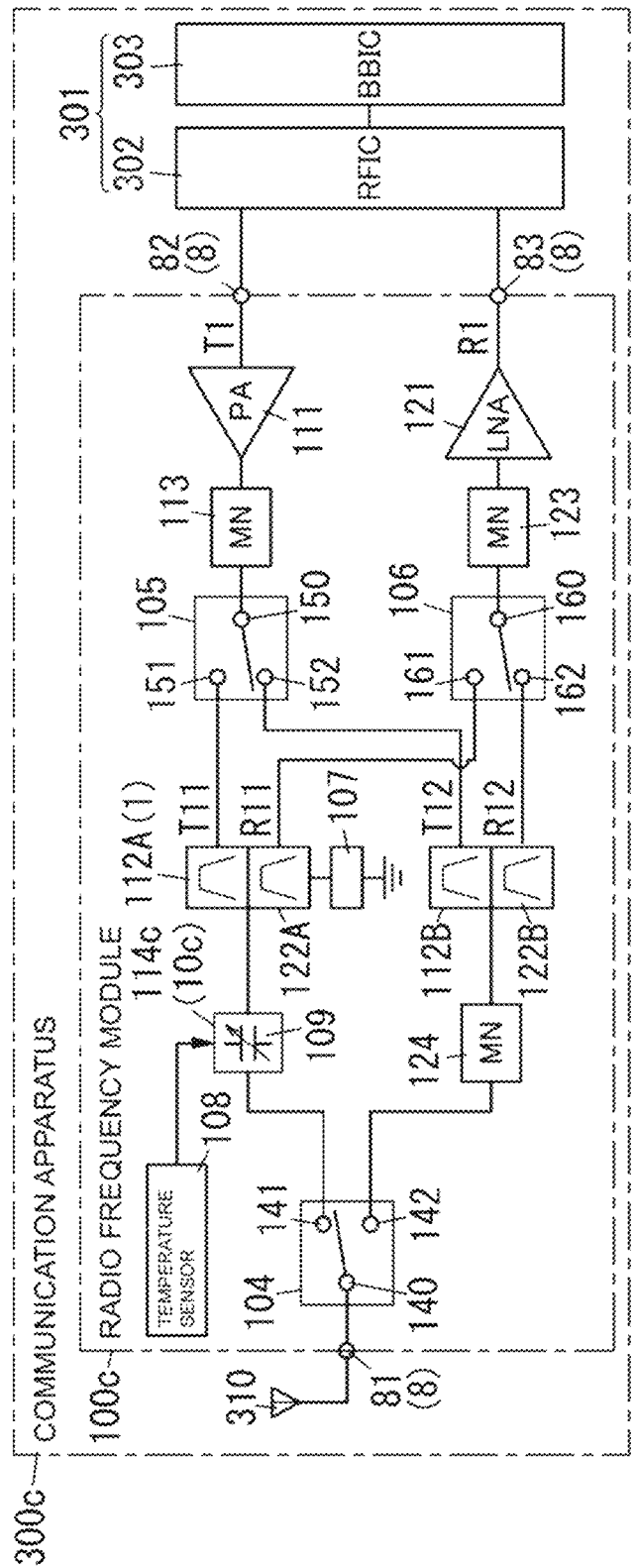
FIG. 7 is a diagram illustrating circuit configurations of a radio frequency module and a communication apparatus according to a second embodiment.

As illustrated in FIG. 7, the matching circuit 114c includes a digitally tunable capacitor (DTC) 109. The digitally tunable capacitor 109 is an element whose electrostatic capacity is adjustable. For example, the pass band of the transmission filter 112A can be corrected by adjusting the electrostatic capacity of the digitally tunable capacitor 109. In the radio frequency module 100c according to the second embodiment, the transmission filter 112A serves as the acoustic wave filter 1. In the radio frequency module 100c according to the second embodiment, the matching circuit 114c serves as the correction circuit 10c.

(1.2) Structure of Radio Frequency Module

A structure of the radio frequency module 100c according to the second embodiment will be described next with reference to FIG. 8.

Figure 8:
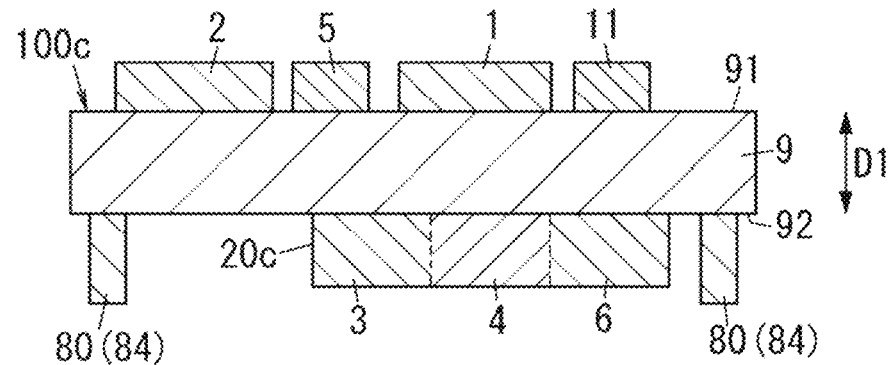
FIG. 8 is a sectional view of the radio frequency module according to the second embodiment.

As illustrated in FIG. 8, the radio frequency module 100c according to the second embodiment includes the mount board 9, a plurality of electronic components, and the plurality of external connection terminals 80. The plurality of electronic components include the first electronic component 1, the second electronic component 2, the third electronic component 3, the fourth electronic component 4, the fifth electronic component 5, the sixth electronic component 6, and an eleventh electronic component 11. The first electronic component 1 is, for example, the transmission filter 112A. The second electronic component 2 is, for example, the power amplifier 111. The third electronic component 3 is, for example, the low noise amplifier 121. The fourth electronic component 4 is, for example, the first switch 104. The fifth electronic component 5 is, for example, the output matching circuit 113. The sixth electronic component 6 is, for example, the temperature sensor 108. The eleventh electronic component 11 is, for example, the matching circuit 114c. It is sufficient that the eleventh electronic component 11 includes at least the digitally tunable capacitor 109. That is, the eleventh electronic component 11 may include part of the matching circuit 114c or the entire matching circuit 114c.

In the radio frequency module 100c according to the second embodiment, at least the first electronic component 1, the second electronic component 2, the fifth electronic component 5, and the eleventh electronic component 11 are disposed on the first principal surface 91 side of the mount board 9. In the radio frequency module 100c according to the second embodiment, at least the third electronic component 3, the fourth electronic component 4, and the sixth electronic component 6 are disposed on the second principal surface 92 side of the mount board 9. In the radio frequency module 100c according to the second embodiment, the third electronic component 3, the fourth electronic component 4, and the sixth electronic component 6 are included in a single chip 20c. That is, in the radio frequency module 100c according to the second embodiment, the temperature sensor 108 and the low noise amplifier 121 are included in the single chip 20c.

In the radio frequency module 100c according to the second embodiment, the second electronic component 2 does not overlap the chip 20c in plan view in the thickness direction D1 of the mount board 9. That is, the power amplifier 111 overlaps neither the temperature sensor 108 nor the first switch 104 in plan view in the thickness direction D1 of the mount board 9. Thus, a ground electrode can be disposed in a region facing the power amplifier 111 in the mount board 9.

In the radio frequency module 100c according to the second embodiment, part of the acoustic wave filter 1 (the first electronic component 1) overlaps the entire first switch 104 (the fourth electronic component 4) in plan view in the thickness direction D1 of the mount board 9. Thus, the area of the mount board 9 in plan view in the thickness direction D1 of the mount board 9 can be reduced.

(2) CHARACTERISTICS OF RADIO FREQUENCY MODULE

Characteristics of the radio frequency module 100c according to the second embodiment will be described next.

In the radio frequency module 100c according to the second embodiment, the transmission filter 112A serves as the acoustic wave filter 1 as described above. As described above, the pass band of the acoustic wave filter 1 shifts toward the low-frequency side as the surface temperature of the acoustic wave filter 1 increases. Thus, a radio frequency signal of a desired frequency band may be rejected by the acoustic wave filter 1.

As described above, the radio frequency module 100c according to the second embodiment includes the digitally tunable capacitor 109, which serves as part of the correction circuit 10c, and the temperature sensor 108. If the electrostatic capacity of the digitally tunable capacitor 109 is adjusted in accordance with the temperature measured by the temperature sensor 108, the pass band that has shifted toward the low-frequency side owing to an increase in temperature can be shifted toward the high-frequency side. That is, the radio frequency module 100c according to the second embodiment can bring the pass band of the acoustic wave filter 1 closer to the desired frequency band even when the pass band of the acoustic wave filter 1 shifts toward the low-frequency side owing to an increase in surface temperature of the acoustic wave filter 1. This allows the use of a low-cost acoustic wave filter that involves a large pass-band shift owing to a change in temperature. Consequently, the low-cost radio frequency module 100c can be implemented. When an acoustic wave filter that involves a small pass-band shift owing to a change in temperature is used, a plurality of acoustic wave filters respectively corresponding to a plurality of bands can be implemented as a single chip. Consequently, the area of the mount board 9 in plan view in the thickness direction D1 of the mount board 9 can be reduced.

(3) SUMMARY

In the radio frequency module 100c according to the second embodiment, the first electronic component 1 is disposed on the first principal surface 91 side of the mount board 9, and the sixth electronic component 6 is disposed on the second principal surface 92 side of the mount board 9. That is, in the radio frequency module 100c according to the second embodiment, the acoustic wave filter 1 is disposed on the first principal surface 91 side of the mount board 9, and the temperature sensor 108 is disposed on the second principal surface 92 side of the mount board 9. Therefore, degradation of isolation between the acoustic wave filter 1 and the temperature sensor 108 can be suppressed, compared with the case where the acoustic wave filter 1 and the temperature sensor 108 are disposed adjacently to each other on the same principal surface (the first principal surface 91 or the second principal surface 92) of the mount board 9, for example. Consequently, a radio frequency signal that passes through the acoustic wave filter 1 can be hindered from entering a path of the temperature sensor 108.

In the radio frequency module 100c according to the second embodiment, the pass band of the acoustic wave filter 1 can be corrected by adjusting the parameter (electrostatic capacity) of a circuit element (the digitally tunable capacitor 109 in this case) connected to the acoustic wave filter 1 in accordance with a measurement result obtained by the temperature sensor 108.

Since the communication apparatus 300c according to the second embodiment includes the radio frequency module 100c, the communication apparatus 300c can suppress deterioration of isolation between the acoustic wave filter 1 and the temperature sensor 108. The communication apparatus 300c can also correct the pass band of the acoustic wave filter 1 in accordance with a measurement result obtained by the temperature sensor 108.

(4) MODIFICATIONS

Modifications of the second embodiment will be described below. The modifications described below may be adopted in combination as appropriate.

(4.1) First Modification

Figure 9:
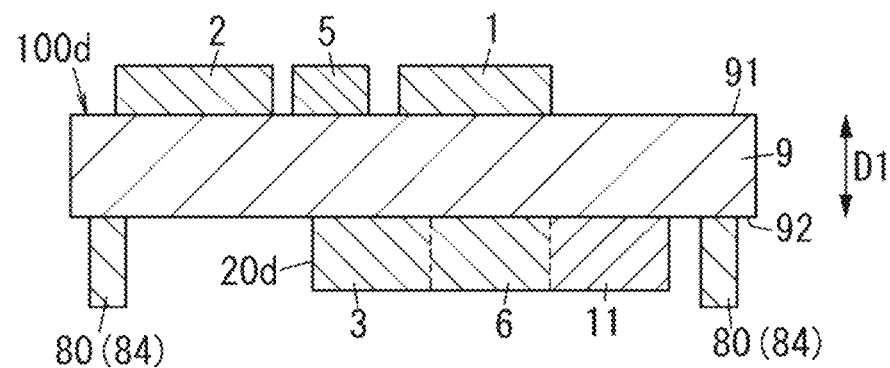
FIG. 9 is a sectional view of a radio frequency module according to a first modification of the second embodiment.

A radio frequency module 100d according to a first modification of the second embodiment will be described with reference to FIG. 9. Components of the radio frequency module 100d according to the first modification that are substantially the same as those of the radio frequency module 100c according to the second embodiment are denoted by the same reference signs, and description of these components are omitted.

In the radio frequency module 100d according to the first modification, the third electronic component 3, the sixth electronic component 6, and the eleventh electronic component 11 are included in a single chip 20d, which is different from the radio frequency module 100c according to the second embodiment.

The third electronic component 3 is, for example, the low noise amplifier 121. The sixth electronic component 6 is, for example, the temperature sensor 108. The eleventh electronic component 11 is, for example, the matching circuit 114c. That is, in the radio frequency module 100d according to the first modification, the low noise amplifier 121, the temperature sensor 108, and the matching circuit 114c are included in the single chip 20d. It is sufficient that at least the digitally tunable capacitor 109 of the matching circuit 114c is included in the chip 20d. That is, part of the matching circuit 114c may be included in the chip 20d, or the entire matching circuit 114c may be included in the chip 20d.

In the radio frequency module 100d according to the first modification, the acoustic wave filter 1 (the first electronic component 1) is disposed on the first principal surface 91 side of the mount board 9, and the temperature sensor 108 (the sixth electronic component 6) is disposed on the second principal surface 92 side of the mount board 9. Thus, the radio frequency module 100d according to the first modification can also suppress deterioration of isolation between the acoustic wave filter 1 and the temperature sensor 108.

The radio frequency module 100d according to the first modification can also correct the pass band of the acoustic wave filter 1 by adjusting the electrostatic capacity of the digitally tunable capacitor 109.

(4.2) Second Modification

Figure 10:
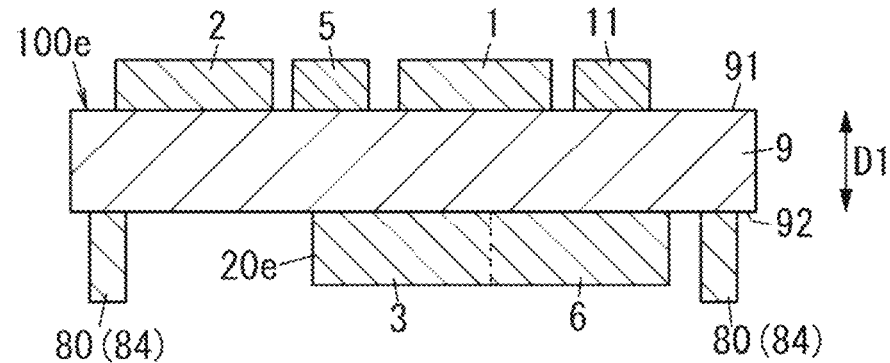
FIG. 10 is a sectional view of a radio frequency module according to a second modification of the second embodiment.

A radio frequency module 100e according to a second modification of the second embodiment will be described with reference to FIG. 10. Components of the radio frequency module 100e according to the second modification that are substantially the same as those of the radio frequency module 100 according to the second embodiment are denoted by the same reference signs, and description of these components are omitted.

In the radio frequency module 100e according to the second modification, the third electronic component 3 and the sixth electronic component 6 are included in a single chip 20e, which is different from the radio frequency module 100c according to the second embodiment.

The third electronic component 3 is, for example, the low noise amplifier 121. The sixth electronic component 6 is, for example, the temperature sensor 108. That is, in the radio frequency module 100e according to the second modification, the low noise amplifier 121 and the temperature sensor 108 are included in the single chip 20e.

In the radio frequency module 100e according to the second modification, the acoustic wave filter 1 (the first electronic component 1) is disposed on the first principal surface 91 side of the mount board 9, and the temperature sensor 108 (the sixth electronic component 6) is disposed on the second principal surface 92 side of the mount board 9. Thus, the radio frequency module 100e according to the second modification can also suppress deterioration of isolation between the acoustic wave filter 1 and the temperature sensor 108.

The radio frequency module 100e according to the second modification can also correct the pass band of the acoustic wave filter 1 by adjusting the electrostatic capacity of the digitally tunable capacitor 109.

(4.3) Third Modification

A radio frequency module 100f according to a third modification of the second embodiment will be described with reference to FIG. 11. Components of the radio frequency module 100f according to the third modification that are substantially the same as those of the radio frequency module 100c according to the second embodiment are denoted by the same reference signs, and description of these components are omitted.

In the radio frequency module 100f according to the third modification, the sixth electronic component 6 is embedded in the mount board 9, which is different from the radio frequency module 100c according to the second embodiment.

Figure 11:
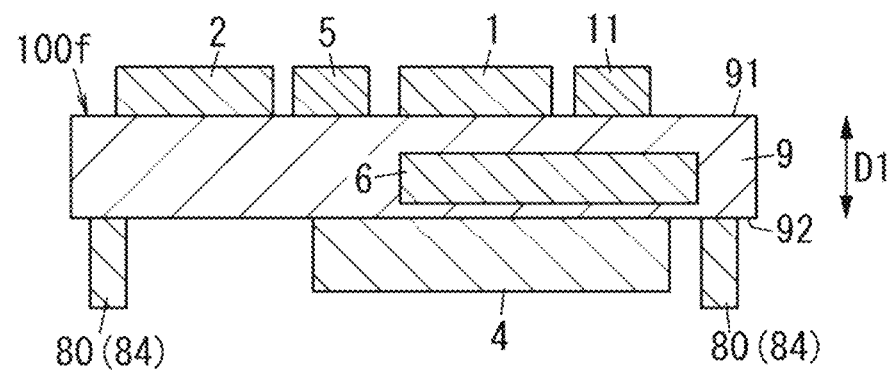
FIG. 11 is a sectional view of a radio frequency module according to a third modification of the second embodiment.

As illustrated in FIG. 11, in the radio frequency module 100f according to the third modification, at least the first electronic component 1, the second electronic component 2, the fifth electronic component 5, and the eleventh electronic component 11 are disposed on the first principal surface 91 side of the mount board 9. In the radio frequency module 100f according to the third modification, at least the fourth electronic component 4 is disposed on the second principal surface 92 side of the mount board 9. In the radio frequency module 100f according to the third modification, the sixth electronic component 6 is embedded in the mount board 9. Specifically, the sixth electronic component 6 is disposed to be closer to the second principal surface 92 than to the first principal surface 91 inside the mount board 9. That is, the sixth electronic component 6 is disposed on the second principal surface 92 side of the mount board 9.

In the radio frequency module 100f according to the third modification, the fourth electronic component 4 is disposed on the second principal surface 92 side of the mount board 9, and the sixth electronic component 6 is embedded in the mount board 9. That is, in the radio frequency module 100f according to the third modification, the first switch 104 and the temperature sensor 108 are discrete components.

In the radio frequency module 100f according to the third modification, the acoustic wave filter 1 (the first electronic component 1) is disposed on the first principal surface 91 side of the mount board 9, and the temperature sensor 108 (the sixth electronic component 6) is disposed on the second principal surface 92 side of the mount board 9. Thus, the radio frequency module 100f according to the third modification can also suppress deterioration of isolation between the acoustic wave filter 1 and the temperature sensor 108.

The radio frequency module 100f according to the third modification can also correct the pass band of the acoustic wave filter 1 by adjusting the electrostatic capacity of the digitally tunable capacitor 109.

(5.4) Fourth Modification

Figure 12:
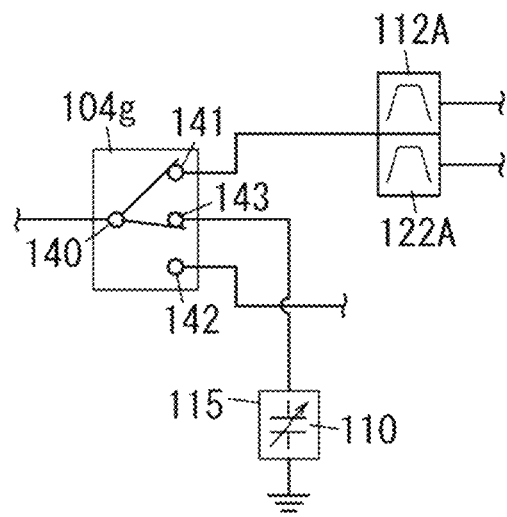
FIG. 12 is a diagram illustrating a circuit configuration of a major part of a radio frequency module according to a fourth modification of the second embodiment.

A radio frequency module according to a fourth modification of the second embodiment will be described with reference to FIG. 12. Components of the radio frequency module according to the fourth modification that are substantially the same as those of the radio frequency module 100c according to the second embodiment are denoted by the same reference signs, and description of these components are omitted.

In the radio frequency module according to the fourth modification, a matching circuit 115 is provided in place of the matching circuit 114c described above, which is different from the radio frequency module 100c according to the second embodiment.

A first switch 104g includes the common terminal 140, and a plurality of (three in the illustrated example) selection terminals 141 to 143. The matching circuit 115 is connected between ground and the selection terminal 143. The matching circuit 115 includes a digitally tunable capacitor 110. The radio frequency module according to the fourth modification can correct the pass band of the acoustic wave filter 1 by adjusting the electrostatic capacity of the digitally tunable capacitor 110.

In the radio frequency module according to the fourth modification, for example, when the transmission filter 112A and the antenna 310 are connected to each other, the common terminal 140 and the selection terminal 141 are connected to each other and the common terminal 140 and the selection terminal 143 are connected to each other.

Consequently, the matching circuit 115 can be connected to a signal path between the transmission filter 112A and the antenna 310.

The configurations described in the second embodiment may be adopted in combination with various configurations (including the modifications) described in the first embodiment as appropriate.

Aspects

Aspects below are disclosed herein.

A radio frequency module (100, 100a to 100f) according to a first aspect includes a mount board (9), an acoustic wave filter (1), a temperature sensor (108), and a correction circuit (10, 10c). The mount board 9 has a first principal surface (91) and a second principal surface (92) facing each other. The acoustic wave filter (1) is disposed on the first principal surface (91) side. The temperature sensor (108) is disposed on the second principal surface (92) side. The correction circuit (10, 10c) corrects a pass band of the acoustic wave filter (1) in accordance with a temperature measured by the temperature sensor 108.

According to this aspect, the acoustic wave filter (1) is disposed on the first principal surface (91) side of the mount board (9), and the temperature sensor (108) is disposed on the second principal surface (92) side of the mount board (9). Thus, deterioration of isolation between the acoustic wave filter (1) and the temperature sensor (108) can be suppressed. The pass band of the acoustic wave filter (1) can also be corrected in accordance with the measurement result obtained by the temperature sensor (108).

In a second aspect, in the radio frequency module (100, 100a to 100f) according to the first aspect, the correction circuit (10, 10c) corrects the pass band of the acoustic wave filter 1 by adjusting a parameter of at least one circuit element (e.g., the digitally tunable inductor 107) connected to the acoustic wave filter (1).

According to this aspect, the pass band of the acoustic wave filter (1) can be corrected by adjusting the parameter of the circuit element.

In a third aspect, in the radio frequency module (100d) according to the first or second aspect, the correction circuit (10c) includes a digitally tunable capacitor (109). The digitally tunable capacitor (109) is disposed on the second principal surface (92) side. The temperature sensor (108) and the digitally tunable capacitor (109) are included in a single chip (20d).

According to this aspect, the area of the mount board (9) in plan view in the thickness direction (D1) of the mount board (9) can be reduced.

In a fourth aspect, the radio frequency module (100, 100a to 100f) according to any one of the first to third aspects further includes a low noise amplifier (121). The low noise amplifier (121) is disposed on the second principal surface (92) side.

According to this aspect, a surface temperature of the low noise amplifier (121) can be measured.

In a fifth aspect, in the radio frequency module (100, 100a to 100e) according to the fourth aspect, the temperature sensor (108) and the low noise amplifier (121) are included in a single chip (20, 20a, 20c, 20d, 20e).

According to this aspect, the area of the mount board (9) in plan view in the thickness direction (D1) of the mount board (9) can be reduced.

In a sixth aspect, the radio frequency module (100, 100c) according to the fourth or fifth aspect further includes an antenna terminal (81) and a switch (104). The switch (104) is disposed on the second principal surface (92) side, and is connected to the antenna terminal (81). The low noise amplifier (121) and the switch (104) are included in a single chip (20, 20c).

According to this aspect, the area of the mount board (9) in plan view in the thickness direction (D1) of the mount board (9) can be reduced.

In a seventh aspect, in the radio frequency module (100, 100a to 100f) according to any one of the first to sixth aspects, the acoustic wave filter (1) overlaps the temperature sensor (108) in plan view in a thickness direction (D1) of the mount board (9).

According to this aspect, the area of the mount board (9) in plan view in the thickness direction (D1) of the mount board (9) can be reduced.

In an eighth aspect, the radio frequency module (100, 100a to 100f) according to any one of the first to seventh aspects further includes a power amplifier (111). The power amplifier (111) is disposed on the first principal surface (91) side.

According to this aspect, the power amplifier (111) that generates a large amount of heat is disposed on the first principal surface (91) side on which the acoustic wave filter (1) is disposed. Thus, the acoustic wave filter (1) is easily influenced by the heat generated by the power amplifier (111). Consequently, an amount by which the pass band of the acoustic wave filter (1) shifts also increases. Thus, according to this aspect, a marked effect of correction of the pass band of the acoustic wave filter (1) is obtained.

In a ninth aspect, the radio frequency module (100, 100c, 100d, 100f) according to the eighth aspect further includes an antenna terminal (81) and a switch (104). The switch (104) is disposed on the second principal surface (92) side, and is connected to the antenna terminal (81).

According to this aspect, the area of the mount board (9) in plan view in the thickness direction (D1) of the mount board (9) can be reduced.

In a tenth aspect, in the radio frequency module (100, 100c) according to the ninth aspect, the power amplifier (111) overlaps neither the temperature sensor (108) nor the switch (104) in plan view in the thickness direction (D1) of the mount board (9).

According to this aspect, a ground electrode can be disposed in a region facing the power amplifier (111) on the mount board (9). Consequently, a heat dissipation effect of the power amplifier (111) can be increased.

In an eleventh aspect, in the radio frequency module (100d) according to any one of the first to tenth aspects, the correction circuit (10c) includes a digitally tunable capacitor (109). The temperature sensor (108) and the digitally tunable capacitor (109) are included in a single chip (20d).

According to this aspect, the area of the mount board (9) in plan view in the thickness direction (D1) of the mount board (9) can be reduced.

In a twelfth aspect, the radio frequency module (100, 100c) according to any one of the first to eleventh aspects further includes an antenna terminal (81) and a switch (104). The switch (104) is disposed on the second principal surface (92) side, and is connected to the antenna terminal (81). The acoustic wave filter (1) overlaps the switch (104) in plan view in a thickness direction (D1) of the mount board (9).

According to this aspect, the area of the mount board (9) in plan view in the thickness direction (D1) of the mount board (9) can be reduced.

In a thirteenth aspect, in the radio frequency module (100, 100a to 100f) according to any one of the first to twelfth aspects, the temperature sensor (108) includes a thermistor (Th1).

According to this aspect, the temperature of the radio frequency module (100, 100a to 100f) can be measured.

A communication apparatus (300, 300c) according to a fourteenth aspect includes the radio frequency module (100, 100a to 100f) according to any one of the first to thirteenth aspects, and a signal processing circuit (301). The signal processing circuit (301) is connected to the radio frequency module (100, 100a to 100f) and processes a radio frequency signal.

According to this aspect, the acoustic wave filter (1) is disposed on the first principal surface (91) side of the mount board (9), and the temperature sensor (108) is disposed on the second principal surface (92) side of the mount board (9). Thus, deterioration of isolation between the acoustic wave filter (1) and the temperature sensor (108) can be suppressed. The pass band of the acoustic wave filter (1) can also be corrected in accordance with the measurement result obtained by the temperature sensor (108).

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio frequency module comprising:
   a mount board having a first principal surface and a second principal surface on opposite sides of the mount board;
   an acoustic wave filter disposed on the first principal surface side of the mount board;
   a temperature sensor disposed on the second principal surface side of the mount board; and
   a correction circuit that corrects a pass band of the acoustic wave filter in accordance with a temperature measured by the temperature sensor,
   wherein the correction circuit includes a digitally tunable capacitor that is disposed on the second principal surface side of the mount board, and
   the temperature sensor and the digitally tunable capacitor are included in a single chip.

2. The radio frequency module according to claim 1, wherein the correction circuit is configured to adjust a parameter of at least one circuit element connected to the acoustic wave filter so as to correct the passband.

3. The radio frequency module according to claim 2, wherein the acoustic wave filter overlaps the temperature sensor in plan view in a thickness direction of the mount board.

4. The radio frequency module according to claim 1, further comprising
   a low noise amplifier disposed on the second principal surface side of the mount board.

5. The radio frequency module according to claim 4, wherein the low noise amplifier is included in the single chip.

6. The radio frequency module according to claim 4, further comprising:
   an antenna terminal; and
   a switch disposed on the second principal surface side of the mount board and connected to the antenna terminal, wherein
   the switch is included in the single chip.

7. The radio frequency module according to claim 6, wherein the acoustic wave filter overlaps the temperature sensor in plan view in a thickness direction of the mount board.

8. The radio frequency module according to claim 4, wherein the acoustic wave filter overlaps the temperature sensor in plan view in a thickness direction of the mount board.

9. The radio frequency module according to claim 1, wherein the acoustic wave filter overlaps the temperature sensor in plan view in a thickness direction of the mount board.

10. The radio frequency module according to claim 9, further comprising;
    a power amplifier disposed on the first principal surface side.

11. The radio frequency module according to claim 10, further comprising:
    an antenna terminal; and
    a switch disposed on the second principal surface side and connected to the antenna terminal.

12. The radio frequency module according to claim 11, wherein the power amplifier overlaps neither the temperature sensor nor the switch in plan view in a thickness direction of the mount board.

13. The radio frequency module according to claim 1, further comprising:
    a power amplifier disposed on the first principal surface side.

14. The radio frequency module according to claim 1, further comprising:
    an antenna terminal; and
    a switch disposed on the second principal surface side of the mount board and connected to the antenna terminal, wherein
    the acoustic wave filter overlaps the switch in plan view in a thickness direction of the mount board.

15. The radio frequency module according to claim 1, wherein the temperature sensor includes a thermistor.

16. The radio frequency module according to claim 1, wherein the digitally tunable capacitor comprises a plurality of inductors connected in series with a corresponding one of a plurality of switches, such that an inductance value of the digitally tunable capacitor may be changed by switching one or more of the plurality of switches on or off.

17. A communication apparatus comprising:
    a radio frequency module; and
    a signal processing circuit that is connected to the radio frequency module and is configured to process a radio frequency signal, wherein
    the radio frequency module includes
    a mount board having a first principal surface and a second principal surface on opposite sides of the mount board,
    an acoustic wave filter disposed on the first principal surface side of the mount board,
    a temperature sensor disposed on the second principal surface side of the mount board, and
    a correction circuit that corrects a pass band of the acoustic wave filter in accordance with a temperature measured by the temperature sensor,
    wherein the correction circuit includes a digitally tunable capacitor that is disposed on the second principal surface side of the mount board, and
    the temperature sensor and the digitally tunable capacitor are included in a single chip.

18. The communication apparatus according to claim 17, wherein the correction circuit is configured to adjust a parameter of at least one circuit element connected to the acoustic wave filter so as to correct the passband.

19. The communication apparatus according to claim 17, wherein the digitally tunable capacitor comprises a plurality of inductors connected in series with a corresponding one of a plurality of switches, such that an inductance value of the digitally tunable capacitor may be changed by switching one or more of the plurality of switches on or off.

\* \* \* \* \*